(12) United States Patent
Kagawa et al.

(10) Patent No.: US 7,602,061 B2
(45) Date of Patent: Oct. 13, 2009

(54) SEMICONDUCTOR DEVICE AND METHOD FOR MANUFACTURING SEMICONDUCTOR DEVICE

(75) Inventors: Yoshihisa Kagawa, Kanagawa (JP); Tsutomu Shimayama, Kanagawa (JP); Takatoshi Kameshima, Kanagawa (JP)

(73) Assignee: Sony Corporation, Tokyo (JP)

( * ) Notice: Subject to any disclaimer, the term of this patent is extended or adjusted under 35 U.S.C. 154(b) by 41 days.

(21) Appl. No.: 11/846,807

(22) Filed: Aug. 29, 2007

(65) Prior Publication Data

US 2008/0054454 A1 Mar. 6, 2008

(30) Foreign Application Priority Data

Sep. 4, 2006 (JP) ............... 2006-238628

(51) Int. Cl.
*H01L 23/48* (2006.01)
*H01L 21/28* (2006.01)

(52) U.S. Cl. ................... 257/734; 438/674

(58) Field of Classification Search ............ 257/734, 257/E21.495, E21.573; 438/618, 623, 628, 438/725, 780, 781, 783, 791
See application file for complete search history.

(56) References Cited

U.S. PATENT DOCUMENTS

| | | | | |
|---|---|---|---|---|
| 6,774,053 B1 * | 8/2004 | Ryan et al. | ................... | 438/780 |
| 7,018,918 B2 * | 3/2006 | Kloster et al. | ............... | 438/623 |
| 2005/0191847 A1 * | 9/2005 | Misawa et al. | ............... | 438/624 |

FOREIGN PATENT DOCUMENTS

| | | |
|---|---|---|
| JP | 2002-334873 | 11/2002 |
| JP | 2004-235548 | 8/2004 |
| JP | 2005-217362 | 8/2005 |
| JP | 2005-243903 | 9/2005 |

OTHER PUBLICATIONS

Gerhard Maier, "The Search for Low-e and ultra-low-e Dielectrics:", Mar./Apr. 2004, IEEE Electrical Insulation Magazine, Vo. 20, No. 2, pp. 6-117.*
G. Kloster et al., "Porosity effects on Low-k dielectric film . . . ", Jun. 3-5, 2002, Interconnect Technology Conference 2002, Proceeedings of the IEEE International, pp. 242-244.*
Japanese Office Action issued on Nov. 25, 2008 corresponding to Japanese Patent Application No. 2006-238628.
Japanese Office Action issued on May 12, 2009 corresponding to JP Application No. 2006-238628.

* cited by examiner

*Primary Examiner*—Thomas L Dickey
*Assistant Examiner*—Nikolay Yushin
(74) *Attorney, Agent, or Firm*—Sonnenschein Nath & Rosenthal LLP

(57) ABSTRACT

Disclosed herein is a semiconductor device including: an insulating film configured to be provided on a substrate and be porosified through decomposition and removal of a pore-forming material; a covering insulating film configured to be provided on the insulating film; and conductive layer patterns configured to be provided in the covering insulating film and the insulating film and reach the substrate, wherein the insulating film includes a non-porous region in which the pore-forming material remains.

5 Claims, 7 Drawing Sheets

F I G . 2
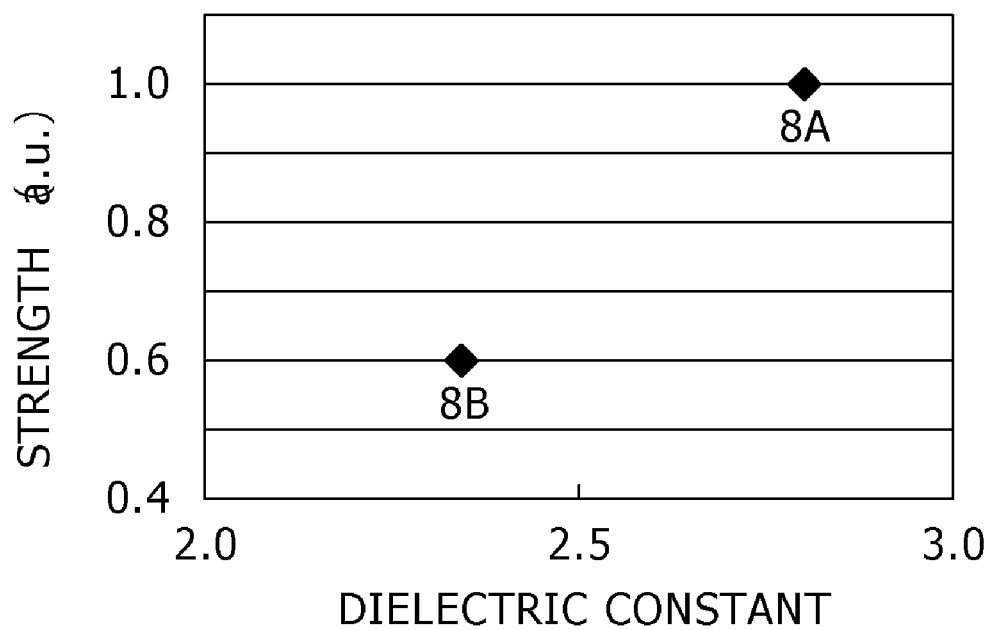

SEMICONDUCTOR DEVICE AND METHOD FOR MANUFACTURING SEMICONDUCTOR DEVICE

CROSS REFERENCES TO RELATED APPLICATIONS

The present invention contains subject matter related to Japanese Patent Application JP 2006-238628 filed in the Japan Patent Office on Sep. 4, 2006, the entire contents of which being incorporated herein by reference.

BACKGROUND OF THE INVENTION

1. Field of the Invention

The present invention relates to a semiconductor device and a method for manufacturing a semiconductor device, and more particularly to a semiconductor device that includes a porosified insulating film and has a multilevel interconnect structure based on a damascene structure and a method for manufacturing the same.

2. Description of the Related Art

In step with miniaturization and increase in the integration degree of semiconductor devices, delay of electrical signals attributed to the time constant of interconnects is increasingly becoming a serious problem. To address this, for conductive layers in a multilevel interconnect structure, use of copper (Cu) interconnects, which have low resistivity, has been advanced instead of use of aluminum (Al) alloy interconnects. The Cu however is difficult to pattern by dry etching unlike metal materials such as Al used in existing multilevel interconnect structures. Therefore, typically multilevel Cu interconnect structures employ a damascene method, in which interconnect trenches are formed in insulating films and a Cu film is buried in the interconnect trenches. In particular, a dual damascene method is attracting attention. In this method, after formation of connection holes and interconnect trenches, Cu is buried in the holes and trenches simultaneously. The dual damascene method therefore is advantageous for reducing the number of steps.

In highly-integrated semiconductor devices, increase in the capacitance between interconnects causes the lowering of the operation speed of the semiconductor devices. Therefore, for such semiconductor devices, minute multilevel interconnects are used for which low dielectric constant materials are used as interlayer insulating films to thereby suppress the increase in the capacitance between interconnects. Examples of the material of the low dielectric constant interlayer insulating film include, in addition to a fluorine-doped silicon oxide (FSG), which is a comparatively proven material having a dielectric constant of about 3.5, low dielectric constant materials having a dielectric constant of about 2.7 such as organic polymers typified by polyarylether (PAE) and inorganic materials typified by hydrogen silsesquioxane (HSQ) and methylsilsesquioxane (MSQ). Furthermore, in recent years, use of low dielectric constant materials that arise from porosification of these materials and have a dielectric constant of about 2.3 is also being attempted.

Regarding the porosification of an insulating film, two methods have been reported. In one method, a film is deposited in such a way that a pore-forming material called a porogen is mixed into a backbone-forming material called a matrix, and then the porogen is removed only by heat treatment (refer to e.g. Japanese Patent Laid-open No. 2004-235548). In the other method, the porogen is removed by electron beam irradiation and heat treatment (refer to e.g. Japanese Patent Laid-open No. 2002-334873).

SUMMARY OF THE INVENTION

However, when a porosified interlayer insulating film is used, although the capacitance between interconnects is decreased, there are problems that the mechanical strength is significantly low and typically the adhesiveness with the lower and upper layers is also low. Accordingly, the following troubles easily occur regarding formation of Cu buried interconnects by a dual damascene method: separation between the porosified interlayer insulating film and the upper and lower layers in a step for removing unnecessary interconnect patterns by chemical mechanical polishing (CMP); dicing crack in a packaging step; and interlayer crack in a bonding step.

According to the present invention, it is desirable to provide a semiconductor device in which a porosified interlayer insulating film is used but the lowering of the mechanical strength of the insulating film and the lowering of the adhesiveness between the insulating film and the upper and lower layers are suppressed, and a method for manufacturing the same.

According to an embodiment of the present invention, there is provided a semiconductor device that includes an insulating film configured to be provided on a substrate and be porosified through decomposition and removal of a pore-forming material, a covering insulating film configured to be provided on the insulating film, and conductive layer patterns configured to be provided in the covering insulating film and the insulating film and reach the substrate. The insulating film includes a non-porous region in which the pore-forming material remains.

In such a semiconductor device, because the porosified insulating film includes the non-porous region, the density of the insulating film is enhanced and the contact areas with the upper and lower layers are increased corresponding to the existence of the non-porous region compared with a semiconductor device that includes an insulating film of which entire region is porosified. This suppresses the lowering of the mechanical strength of the insulating film and the lowering of the adhesiveness with the upper and lower layers.

Furthermore, in a method for manufacturing a semiconductor device according to another embodiment of the present invention, the following steps are sequentially carried out. Initially, a non-porous insulating film that contains a pore-forming material is formed on a substrate. Subsequently, a covering insulating film that prevents the pore-forming material from being removed from the upper side of the insulating film through decomposition is formed on the insulating film. Subsequently, a trench pattern that reaches the substrate is formed in the covering insulating film and the insulating film. Subsequently, the pore-forming material in the insulating film is decomposed and removed from the trench pattern to thereby porosify the insulating film. Thereafter, a conductive layer pattern is formed by burying a conductive material in the trench pattern.

In such a method for manufacturing a semiconductor device, the insulating film is porosified through decomposition and removal of the pore-forming material in the insulating film from the trench pattern after the formation of the covering insulating film that prevents the pore-forming material from being removed from the upper side of the insulating film through the decomposition. Therefore, a region in the insulating film remote from the trench pattern is kept as a non-porous region in which the pore-forming material remains. This allows manufacturing of the above-described semiconductor device including a porosified insulating film that has therein a non-porous region.

As described above, in the semiconductor device and the manufacturing method thereof according to the embodiments of the present invention, the lowering of the mechanical strength of an insulating film and the lowering of the adhesiveness between the insulating film and the upper and lower layers are suppressed. Thus, the interconnect reliability can be improved, which can enhance the quality and performance of the semiconductor device.

The above and other features and advantages of the present invention will become apparent from the following description when taken in conjunction with the accompanying drawings which illustrate preferred embodiments of the present invention by way of example.

BRIEF DESCRIPTION OF THE DRAWINGS

FIG. 2 is a graph showing the relationships between the dielectric constant and strength of a non-porous region and a porous region in an insulating film;

DETAILED DESCRIPTION OF THE PREFERRED EMBODIMENTS

The embodiments of the present invention will be described in details below based on the drawings.

The present embodiment example is one example of a method for manufacturing a semiconductor device according to an embodiment of the present invention, and relates to a dual damascene structure.

Figure 1:
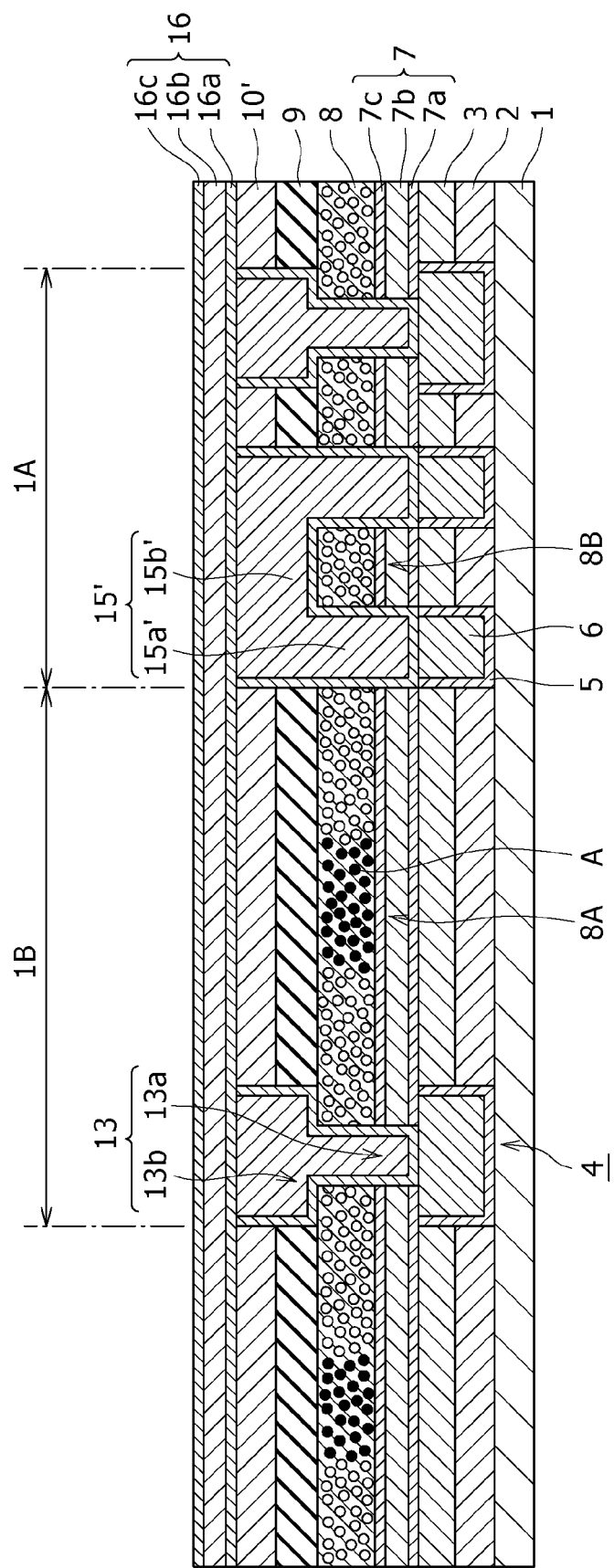
FIG. 1 is a sectional view for explaining a method for manufacturing a semiconductor device according to an embodiment of the present invention.

As shown in FIG. 1, a multi-layer film formed of a polyarylether (PAE) film 2 and a carbon-doped silicon oxide (SiOC) film 3 is provided on a base substrate 1 obtained by forming a base insulating film composed of e.g. silicon oxide ($SiO_2$) over a semiconductor substrate on which an element region and so on (not shown) are formed. In this multi-layer film, interconnect trenches 4 that reach the base substrate 1 are provided. In the interconnect trenches 4, buried interconnects (interconnects) 6 composed of e.g. Cu are provided with the intermediary of a barrier metal 5 composed of e.g. tantalum (Ta).

Provided on the interconnects 6 and the SiOC film 3 is an etching stopper film 7 that is obtained by sequentially depositing a silicon carbonitride (SiCN) layer 7a, a silicon carbide (SiC) layer 7b, and an SiCN layer 7c in that order from the lower side. The etching stopper film 7 serves as an etching stopper and also as a diffusion barrier film and an antioxidation film for the Cu interconnects 6. Although the etching stopper film 7 is formed of a three-layer structure in this example, it may be formed of a SiCN or SiC single layer.

Over the etching stopper film 7, a first insulating film 8 formed of a porosified insulating film, a second insulating film 9 formed of an organic insulating film such as a PAE film, and a first mask 10' composed of e.g. $SiO_2$ are sequentially deposited. In the first mask 10', the second insulating film 9, the first insulating film 8, and the etching stopper film 7, trench patterns 13 reaching the lower interconnects 6 are provided. In the trench patterns 13, conductive layer patterns 15' are provided with the intermediary of a barrier metal film 14. The conductive layer pattern 15' is formed of a via 15a' and an interconnect 15b'. The via 15a' reaches the lower interconnect 6 and is provided in the first insulating film 8 and the etching stopper film 7. The interconnect 15b' communicates with the upper part of the via 15a' and is provided in the first mask 10' and the second insulating film 9.

Provided on the interconnects 15b' and the first mask 10' is an etching stopper film 16 that is obtained by sequentially depositing an SiCN layer 16a, a silicon carbide (SiC) layer 16b, and an SiCN layer 16c in that order from the lower side.

The first insulating film 8 is obtained by depositing e.g. a non-porous SiOC film that contains a pore-forming material (porogen) A and then porosifying the film through decomposition and removal of the porogen A. A feature of the present embodiment is that the first insulating film 8 includes non-porous regions 8A in which the porogen A remains. This feature enhances the density and strength of the first insulating film 8. Furthermore, this feature increases the contact areas between the first insulating film 8 and the upper second insulating film 9 and the lower etching stopper film 7 (SiCN layer 7c), and thus suppresses the deterioration of the adhesiveness.

If this semiconductor device includes a first region 1A in which the conductive layer patterns 15', particularly the interconnects 15b', are densely disposed, and a second region 1B in which the conductive layer patterns 15' are disposed more sparsely than in the first region 1A, it is preferable that the non-porous region 8A be disposed at the center part of an area between the conductive layer patterns 15' in the second region 1B. If this configuration is employed, in the first region 1A, in which the conductive layer patterns 15' are densely disposed and hence the capacitance between interconnects tends to be high, the first insulating film 8 between the conductive layer patterns 15' is porosified, which decreases the dielectric constant and thus prevents the increase in the capacitance between interconnects. On the other hand, in the second region 1B, in which the conductive layer patterns 15' are sparsely disposed, the capacitance between interconnects leads to no problem. Therefore, in addition to the prevention of the increase in the capacitance between interconnects, the strength of the first insulating film 8 is enhanced and the deterioration of the adhesiveness is suppressed.

It is preferable that the differences in the dielectric constant and density be equal to or larger than 20% and 0.2 g/cm$^3$, respectively, between the non-porous region 8A and a porous region 8B arising from complete porosification of the first insulating film 8. If such a configuration is employed, in the first region 1A, in which the conductive layer patterns 15' are densely disposed, increase in the capacitance between interconnects can be surely prevented. In addition, in the second region 1B, in which the conductive layer patterns 15' are sparsely disposed, the strength of the first insulating film 8 can be enhanced by allowing the first insulating film 8 to have a higher density.

Although the first insulating film 8 is formed by using a porous SiOC film in this example, it may be formed by using a porous PAE film.

The second insulating film 9 in the present embodiment is equivalent to the covering insulating film set forth in the claims. As described later in detail in the description of a manufacturing method, in a step for removing the porogen A in the first insulating film 8 through its decomposition, the second insulating film 9 prevents the porogen A from being removed from the upper side of the first insulating film 8. Therefore, it is preferable that the second insulating film 9 be formed of a non-porous insulating film.

In this example, the second insulating film 9 is composed of PAE. However, there is no particular limitation and it may be composed of SiOC.

FIG. 2 is a graph showing the relationships between the dielectric constant and strength regarding the non-porous region 8A and the porous region 8B arising from complete porosification through decomposition and removal of the porogen A. As shown in this graph, it is proved that the strength of the non-porous region 8A with a dielectric constant of 2.8 is higher by about 60% than that of the porous region 8B with a dielectric constant of 2.4. The densities of the non-porous region 8A and the porous region 8B were 1.3 g/cm$^3$ and 1.1 g/cm$^3$, respectively.

The above-described semiconductor device is manufacturing by the method to be described below.

Figure 3A:
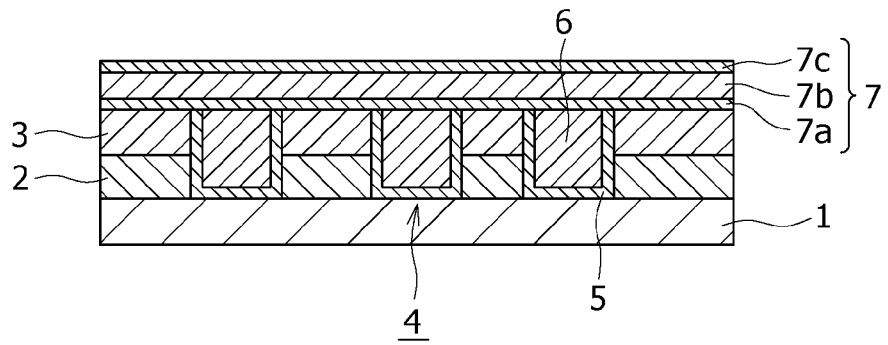
FIGS. 3A to 3K are sectional views for explaining manufacturing steps of the method for manufacturing a semiconductor device according to the embodiment of the present invention.

Referring initially to FIG. 3A, the PAE film 2 and the SiOC film 3 are sequentially deposited over the base substrate 1 obtained by forming a base insulating film composed of e.g. SiO$_2$ over a semiconductor substrate on which an element region and so on (not shown) are formed. Subsequently, the interconnects 6 are formed by burying a conductive material composed of Cu in the interconnect trenches 4 provided in the multi-layer film with the intermediary of the barrier metal 5 composed of Ta. Subsequently, the etching stopper film 7 is formed on the interconnects 6 and the SiOC film 3 by sequentially depositing the SiCN layer 7a, the SiC layer 7b, and the SiCN layer 7c in that order from the lower side. The resultant structure is equivalent to the substrate set forth in the claims.

Figure 3B:
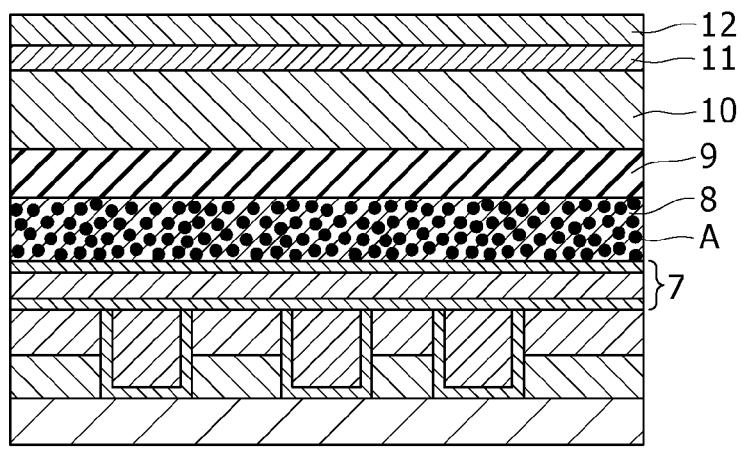

Referring next to FIG. 3B, on the etching stopper film 7, the first insulating film 8 that contains the porogen A and is formed of e.g. a SiOC film is deposited to a film thickness of 90 nm. It is preferable that the porogen A be so mixed in the first insulating film 8 that the difference of the dielectric constant will be 20% or higher between the first insulating film 8 containing the porogen A and the first insulating film 8 from which the porogen A has been removed through its decomposition.

On the first insulating film 8, the second insulating film 9 composed of an organic low dielectric constant material such as PAE is formed to a film thickness of 90 nm.

Subsequently, over the second insulating film 9, a first mask forming layer 10 formed of e.g. an SiO$_2$ layer, a second mask forming layer 11 formed of e.g. an SiCN layer, and a third mask forming layer 12 formed of e.g. an SiO$_2$ layer are sequentially deposited. The film thicknesses of the first mask forming layer 10, the second mask forming layer 11, and the third mask forming layer 12 are 150 nm, 50 nm, and 50 nm, respectively. A method for forming connection hole patterns and interconnect trench patterns by use of this three-layer mask is described in detail in Japanese Patent Laid-open No. 2004-63859 and "2003 Symposium on VLSI Technology" page 107.

The first mask forming layer 10 and the third mask forming layer 12, which are formed of an SiO$_2$ layer, can be deposited by e.g. plasma CVD in which monosilane (SiH$_4$) is used as a silicon source and a dinitrogen monoxide (N$_2$O) gas is used as an oxidant.

Figure 3C:
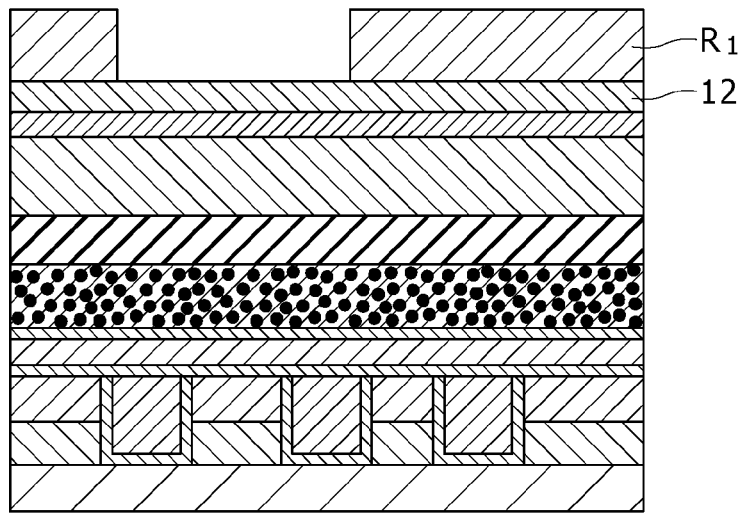

Referring next to FIG. 3C, a resist mask R$_1$ having an interconnect trench pattern is formed on the third mask forming layer 12.

Figure 3D:
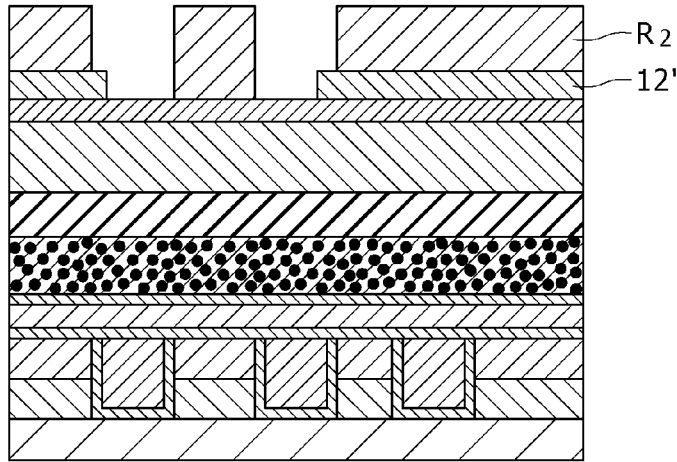

Subsequently, as shown in FIG. 3D, by dry etching with use of the resist mask R$_1$ (see FIG. 3C) as the etching mask, the third mask forming layer 12 (see FIG. 3C) formed of a SiO$_2$ layer is etched to form a third mask 12'. For this etching of the third mask forming layer 12 by use of the resist mask R$_1$, a general magnetron etching apparatus is used. Thereafter, ashing treatment based on e.g. oxygen (O$_2$) plasma and chemical treatment employing an organic amine chemical are carried out to thereby completely remove the resist mask R$_1$ and residual fouling produced in the etching treatment.

Subsequently, a resist mask R$_2$ having a connection hole pattern is formed on the third mask 12' and the second mask forming layer 11. At this time, the pattern of the resist mask R$_2$ is so formed that at least a part of the connection hole pattern provided in the resist mask R$_2$ overlaps with an aperture of the third mask 12'.

Figure 3E:
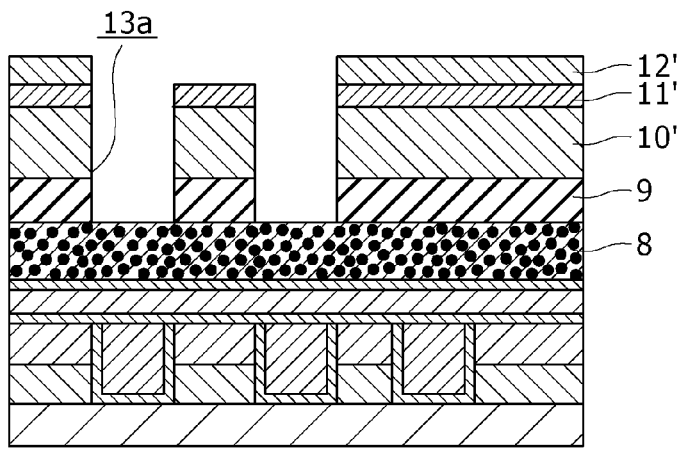

Referring next to FIG. 3E, by dry etching with use of the resist mask R$_2$ (see FIG. 3D) having the connection hole pattern as the etching mask, the third mask 12', the second mask forming layer 11, and the first mask forming layer 10 are etched, and furthermore the second insulating film 9 is also etched. Thus, connection holes 13a exposing the surface of the first insulating film 8 are formed.

For the etching of the layers from the third mask 12' to the first mask forming layer 10, a general magnetron etching apparatus is used and e.g. CHF$_3$, oxygen (O$_2$), and Ar are employed as the etching gas. The gas flow rate ratio CHF$_3$: O$_2$:Ar is set to 5:1:50, and the bias power and the substrate temperature are set to 1000 W and 40° C., respectively.

Also for the etching of the second insulating film 9, a general magnetron etching apparatus is used. The resist mask R$_2$ is removed simultaneously with the etching of the second insulating film 9. The third mask 12' that remains through this etching serves as a mask having the interconnect trench pattern. Furthermore, a second mask 11', of which pattern is formed through the etching of the second mask forming layer 11, serves as a mask having the connection hole pattern.

Figure 3F:
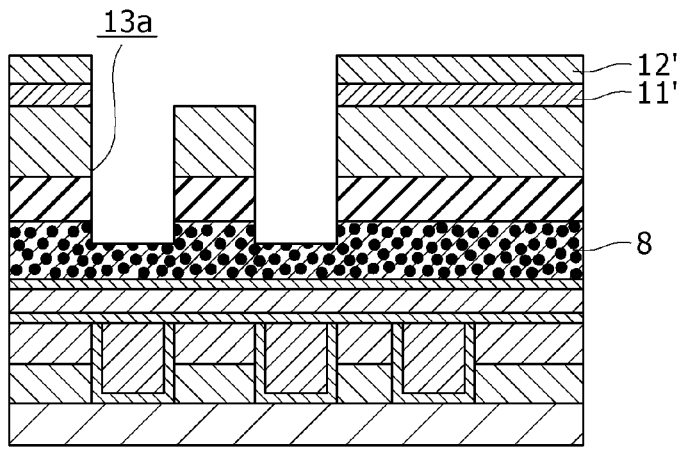

Referring next to FIG. 3F, the interconnect trench pattern is formed in the second mask 11' by dry etching in which the third mask 12' having the interconnect trench pattern is used as the etching mask. Furthermore, this etching extends the connection holes 13a downward partway across the first insulating film 8.

Figure 3G:
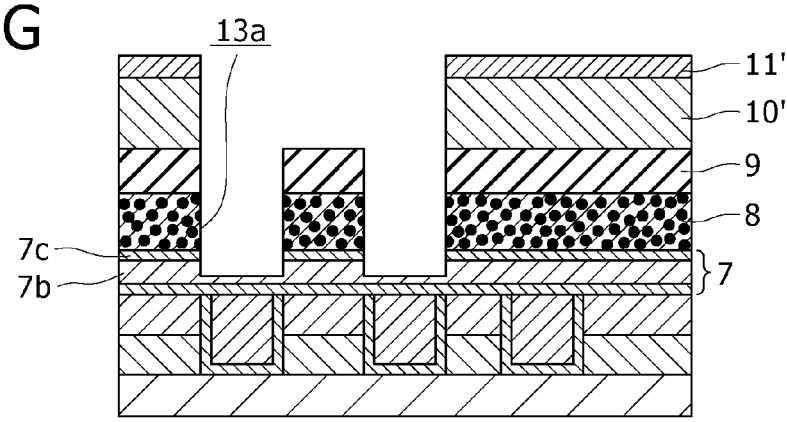

Referring next to FIG. 3G, the interconnect trench pattern is formed in the first mask 10' by dry etching in which the third mask 12' (see FIG. 3F) and the second mask 11' are used as the etching mask.

In this dry etching, a general magnetron etching apparatus is used and C$_4$F$_8$, CO, nitrogen (N$_2$), and Ar are employed as the etching gas for example. The gas flow rate ratio C$_4$F$_8$:CO: N$_2$:Ar is set to 3:10:200:500, and the bias power and the substrate temperature are set to 1000 W and 20° C., respectively.

Under such an etching condition, the third mask 12' is removed along with the progression of the etching. After the third mask 12' is completely removed, the second mask 11' serves as the etching mask. Concurrently with this etching, the connection holes 13a are extended downward to the etching stopper film 7 in such a way that the first mask 10' having the connection hole pattern serves as the mask. After the interconnect trench pattern is provided in the first mask 10', the second insulating film 9 having the connection hole pattern serves as the mask. In this case, the SiCN layer 7c as the uppermost layer of the etching stopper film 7 is removed, so that the connection holes 13a are further extended downward partway across the SiC layer 7b, which is the middle layer of the etching stopper film 7.

Figure 3H:
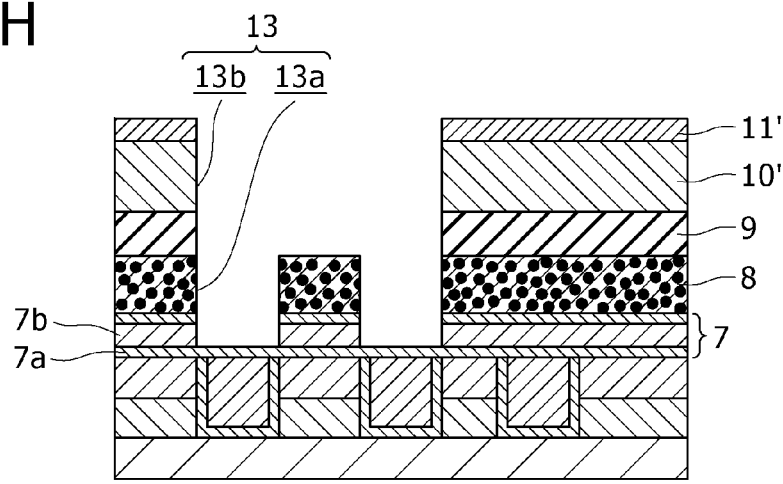

Referring next to FIG. 3H, by using the second mask 11' having the interconnect trench pattern, the second insulating film 9 that remains at the bottom of the interconnect trench pattern of the first mask 10' is etched. This extends the interconnect trench pattern formed in the first mask 10' downward, which results in the state in which the interconnect trench 13b is formed in the second mask 11', the first mask 10', and the second insulating film 9. In the above-described manner, the trench pattern 13 formed of the connection holes 13a and the interconnect trench 13b is formed.

Through this etching, the SiC layer 7b that remains at the bottom of the connection holes 13a is removed, and thus only the SiCN layer 7a as the lowermost layer of the etching stopper film 7 remains at the bottoms of the connection holes 13a.

Figure 3I:
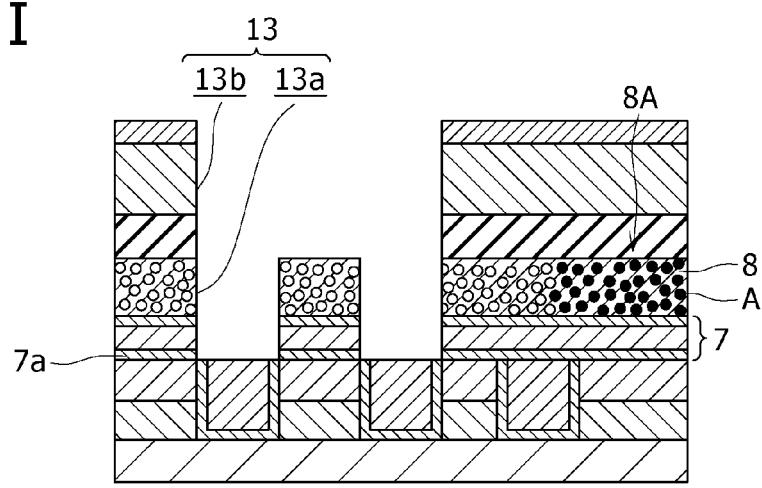

Subsequently, as shown in FIG. 3I, the SiCN layer 7a as the lowermost layer of the etching stopper film 7 remaining at the bottom of the connection holes 13a is removed by etching, so that the surface of the lower Cu interconnects 6 is exposed. In this dry etching, a general magnetron etching apparatus is used and $CH_2F_2$, $O_2$ and Ar are employed as the etching gas for example. The gas flow rate ratio $CH_2F_2$:$O_2$:Ar is set to 2:1:5, and the bias power is set to 100 W.

Thereafter, heat treatment such as furnace annealing is carried out at 400° C. or lower. In this heat treatment, the porogen A is decomposed and removed from the trench pattern 13 because the first insulating film 8 is covered by the non-porous second insulating film 9. Therefore, although the porogen A near the trench pattern 13 is removed, the porogen A in an area remote from the trench pattern 13 is not removed but remains because it is covered by the second insulating film 9. Consequently, in a region in which the trench patterns 13 are densely formed, the first insulating film 8 is surely porosified. In contrast, in a region in which the trench patterns 13 are sparsely formed, the non-porous region 8A is formed at the center part of an area between the trench patterns 13. As described later, a conductive material is buried in the trench patterns 13 to thereby form conductive layer patterns. Therefore, the non-porous region 8A is formed at the center part of an area between the conductive layer patterns in a region in which the conductive layer patterns are sparsely formed.

After the above-described steps, by post treatment employing a chemical and RF-sputtering treatment, etching fouling that remains on the sidewalls of the interconnect trenches 13b and the connection holes 13a are removed, and Cu modified layers of the Cu interconnects 6 exposed at the bottoms of the connection holes 13a are converted to normal Cu layers.

Figure 3J:
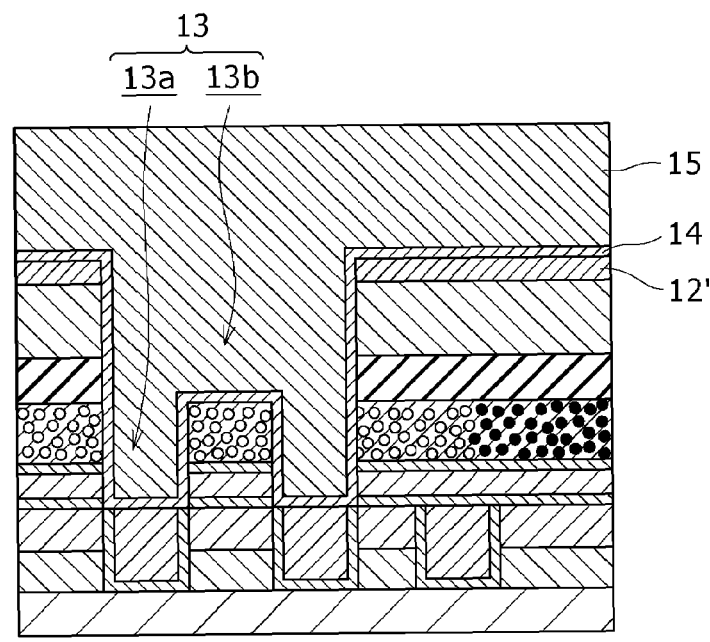

Thereafter, as shown in FIG. 3J, the barrier metal film 14 composed of Ta is deposited by e.g. sputtering on the second mask 11' in such a manner as to cover the inside wall of the trench pattern 13. Subsequently, a conductive film 15 composed of Cu is deposited on the barrier metal film 14 by electrolytic plating or sputtering in such a manner as to fill the trench pattern 13, so that the interconnect trench 13b and the connection holes 13a are simultaneously filled.

Figure 3K:
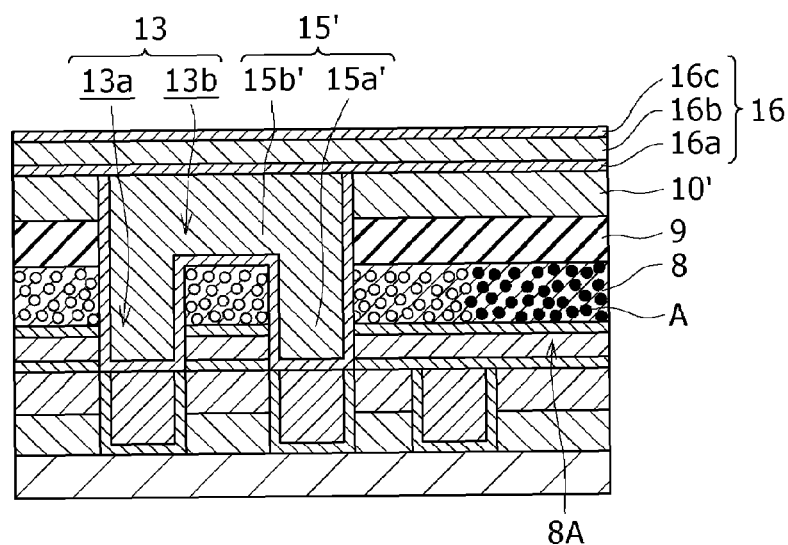

Referring next to FIG. 3K, by CMP, part of the conductive film 15 (see FIG. 3J) and the barrier metal film 14 unnecessary for the interconnect pattern is removed, and furthermore the second mask 11' and an upper part of the first mask 10' are also removed. Thereby, the vias 15a' composed of Cu are formed in the connection holes 13a and the Cu interconnect 15b' is formed in the interconnect trench 13b, so that the conductive layer pattern 15' formed of the vias 15a' and the Cu interconnect 15b' is formed inside the trench pattern 13.

Thereafter, similarly to the etching stopper film 7 on the lower Cu interconnects 6, the etching stopper film 16 formed of e.g. the SiCN layer 16a/SiC layer 16b/SiCN layer 16c is formed on the interconnects 15b' and the first mask 10'. As subsequent steps, the steps described with FIGS. 3B to 3K are repeated, which can form a multilevel interconnect structure by a dual damascene method.

According to such a semiconductor device and a manufacturing method thereof, the non-porous second insulating film 9 is formed as a covering insulating film on the first insulating film 8, and then the first insulating film 8 is porosified by decomposing and removing the porogen A in the first insulating film 8 from the trench pattern 13. Therefore, a region in the first insulating film 8 remote from the trench pattern 13 is kept as a non-porous region. This allows manufacturing of a semiconductor device that has the non-porous region 8A at the center part of the first insulating film 8 between the conductive layer patterns 15' in the region 1B, in which the conductive layer patterns 15' are sparsely disposed. Thus, the strength of the first insulating film 8 can be enhanced and the lowering of the adhesiveness of the first insulating film 8 is suppressed. Consequently, the interconnect reliability can be improved, which can enhance the quality and performance of a semiconductor device.

MODIFICATION EXAMPLE

Figure 4:
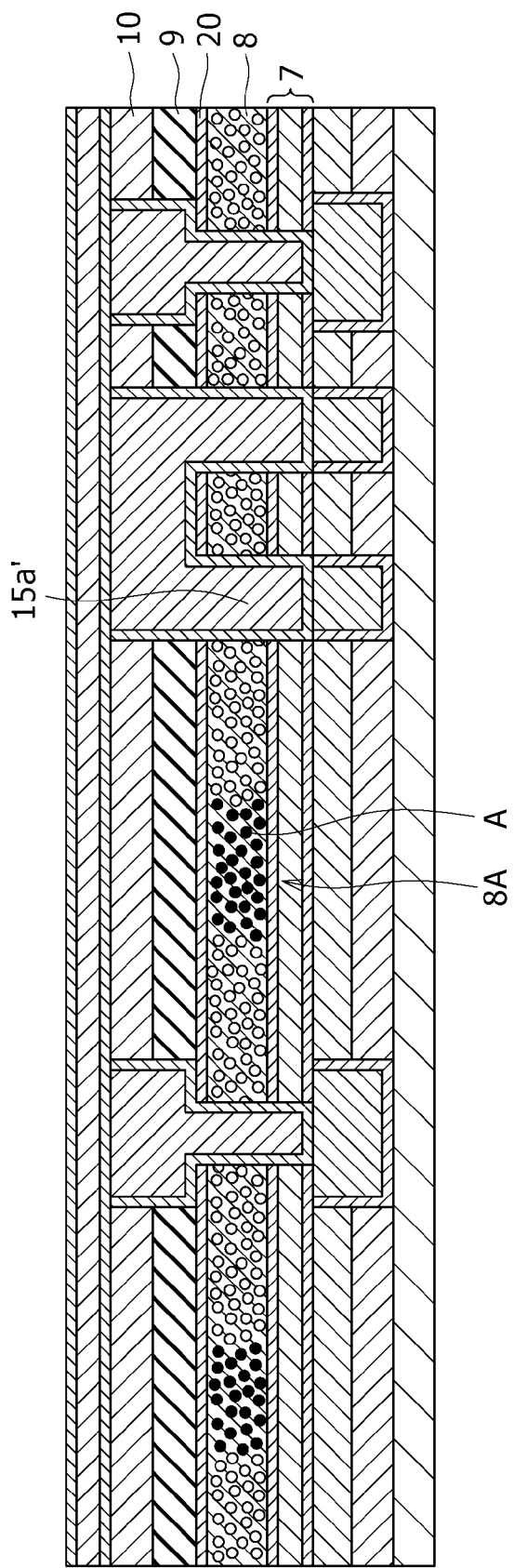
FIG. 4 is a sectional view for explaining a modification example of a semiconductor device according to the embodiment of the present invention.

In the above-described embodiment example, the second insulating film 9 serves as a covering insulating film. However, as shown in FIG. 4, a covering insulating film 20 may be provided between the first insulating film 8 and the second insulating film 9. It is preferable that the covering insulating film 20 be a non-porous low dielectric constant material film, and it has a film thickness of 5 nm to 15 nm. In this example, the covering insulating film 20 composed of SiOC and having a film thickness of 15 nm is provided. When the covering insulating film 20 is thus interposed, the covering insulating film 20 prevents the porogen A from being removed through its decomposition from the upper side of the first insulating film 8, and therefore it is preferable that the second insulating film 9 be formed of a SiOC or PAE porous insulating film.

In this case, the vias 15a' are provided in the covering insulating film 20, the first insulating film 8, and the etching stopper film 7, and are formed by a method similar to that for the embodiment.

Such a semiconductor device and a manufacturing method thereof also offer the same advantages as those of the embodiment because the covering insulating film 20 is formed on the first insulating film 8. Furthermore, in the semiconductor device of the present modification example, the capacitance between interconnects can be further decreased because a porous insulating film is used as the second insulating film 9.

The above-described embodiment and modification example are explained by using an example of a dual damascene structure. However, the present invention is not limited thereto but an embodiment thereof can be applied also to a single damascene structure.

While preferred embodiments of the present invention have been described using specific terms, such description is for illustrative purposes, and it is to be understood that changes and variations may be made without departing from the spirit or scope of the following claims.

What is claimed is:

1. A semiconductor device comprising:
   a substrate;
   an insulating film on the substrate and porosified through decomposition and removal of a pore-forming material;
   a covering insulating film on the insulating film; and
   conductive layer patterns in the covering insulating film and the insulating film which extend through the covering insulating film and insulating film to the substrate,
   wherein,
      the insulating film includes a non-porous region in which the pore-forming material remains,
      the covering insulating film and the insulating film include a first region in which the conductive layer patterns are densely disposed and a second region in which the conductive layer patterns are disposed more sparsely than in the first region, and the non-porous region is located centrally between the conductive layer patterns in the second region.

2. The semiconductor device according to claim 1, wherein the covering insulating film consists of a nonporous insulating film.

3. The semiconductor device according to claim 1, wherein the conductive layer pattern is formed of a via that is provided in the insulating film and extends to the substrate and an interconnect that is provided in the covering insulating film and communicates with an upper part of the via.

4. The semiconductor device according to claim 1, wherein the non-porous region in the insulating film has a dielectric constant that is at least 20% higher than a dielectric constant of a porosified region in the insulating film.

5. A method for manufacturing a semiconductor device, the method comprising the steps of:

forming on a substrate a non-porous insulating film that contains a pore-forming material;

forming on the insulating film a covering insulating film that prevents the pore-forming material from being removed from an upper side of the insulating film through decomposition;

forming a trench pattern that extends through the covering insulating film and the insulating film to the substrate in;

decomposing and removing the pore-forming material in the insulating film from the trench pattern to thereby porosify the insulating film; and forming a conductive layer pattern by burying a conductive material in the trench pattern, wherein, the covering insulating film and the insulating film include a first region in which the conductive layer patterns are densely disposed and a second region in which the conductive layer patterns are disposed more sparsely than in the first region, and the non-porous region is provided at a center part of an area between the conductive layer patterns in the second region.

* * * * *